United States Patent
Sipp et al.

(10) Patent No.: US 10,749,256 B1
(45) Date of Patent: Aug. 18, 2020

(54) WAVEGUIDE ADAPTER FOR SLOT ANTENNAS

(71) Applicant: Raytheon Company, Waltham, MA (US)

(72) Inventors: Carissa Sipp, Tucson, AZ (US); Kim Poulson, Tucson, AZ (US); Darrick M. Buban, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 28 days.

(21) Appl. No.: 16/261,677

(22) Filed: Jan. 30, 2019

(51) Int. Cl.
| H01Q 3/26 | (2006.01) |
| H01Q 21/00 | (2006.01) |
| H01P 5/107 | (2006.01) |
| H01Q 1/48 | (2006.01) |
| H01Q 13/10 | (2006.01) |

(52) U.S. Cl.
CPC ............ H01Q 3/267 (2013.01); H01P 5/107 (2013.01); H01Q 1/48 (2013.01); H01Q 13/10 (2013.01); H01Q 21/0075 (2013.01)

(58) Field of Classification Search
CPC .... H01Q 3/267; H01Q 21/0075; H01Q 13/10; H01Q 1/48; H01P 5/107
USPC ......................................................... 343/703
See application file for complete search history.

(56) References Cited

U.S. PATENT DOCUMENTS

| 3,353,123 | A | * | 11/1967 | Met ..................... | H01P 1/162 |
| | | | | | 333/211 |
| 5,786,739 | A | * | 7/1998 | Paul ..................... | H01P 5/107 |
| | | | | | 333/210 |
| 5,940,347 | A | * | 8/1999 | Raida ..................... | G10K 11/24 |
| | | | | | 367/138 |
| 6,642,908 | B2 | * | 11/2003 | Pleva ..................... | G01S 13/346 |
| | | | | | 343/876 |
| 2002/0021865 | A1 | * | 2/2002 | Cheung ................ | H01Q 13/025 |
| | | | | | 385/28 |
| 2005/0128024 | A1 | * | 6/2005 | Liess ....................... | B61L 3/227 |
| | | | | | 333/24 R |
| 2005/0200423 | A1 | * | 9/2005 | Freeman ................. | H01P 5/103 |
| | | | | | 333/26 |
| 2008/0280568 | A1 | * | 11/2008 | Kielb ................. | G05B 19/4185 |
| | | | | | 455/74.1 |
| 2009/0079648 | A1 | * | 3/2009 | Matsuo .............. | H01Q 21/0087 |
| | | | | | 343/771 |
| 2009/0311971 | A1 | * | 12/2009 | Kielb ................ | H04L 12/40045 |
| | | | | | 455/74.1 |
| 2016/0262254 | A1 | * | 9/2016 | Meijer .................. | G01F 23/284 |

(Continued)

*Primary Examiner* — Don P Le
(74) *Attorney, Agent, or Firm* — Daly, Crowley, Mofford & Durkee LLP

(57) ABSTRACT

Embodiments if the present disclosure relate to a radio frequency (RF) adapter configured to mimic the load that an antenna element would see if it was otherwise radiating into free space. The adapter is configured to come in direct contact with an antenna ground plane so that modes of propagation may be established, and energy coupled from a radiating antenna element into the adapter. The adapter may be of any form that will support direct coupling and include a waveguide (WG) that is coupled to a planar slot radiating element of an antenna array. The WG can have a length, width, height, and a central longitudinal axis and an internal surface. A resistive load can be disposed along the central longitudinal axis of the WG and a reactive load can be disposed in the internal surface of the WG.

14 Claims, 6 Drawing Sheets

(56) References Cited

U.S. PATENT DOCUMENTS

2018/0367100 A1* 12/2018 Ejeckam ............... H01L 29/778
2020/0003602 A1*  1/2020 Gurumohan ........... B65D 41/26

* cited by examiner

WAVEGUIDE ADAPTER FOR SLOT ANTENNAS

BACKGROUND

Antennas can be characterized by their far field gain patterns. Some antennas have complex mechanical feed structures that are time consuming to assemble and test (e.g. to determine antenna feed performance characteristics). Typically, a specialized antenna measurement facility is required to test an antenna and determine the performance of the antenna including the associate feed structure. One testing method is to use a near field antenna scanning system to collect data and then post process that data to characterize the antenna feed. This method has shortcomings in that it does not capture all of the radiated energy, requires specialized equipment and/or facilities and is not well suited to in-process testing (i.e. such specialized equipment and/or facilities are sometimes not well suited for testing of antenna subsystem (e.g. such as a feed assembly) during the manufacturing/assembly process.

SUMMARY

This Summary is provided to introduce a selection of concepts in simplified form that are further described below in the Detailed Description. This Summary is not intended to identify key or essential features or combinations of the claimed subject matter, nor is it intended to be used to limit the scope of the claimed subject matter.

Embodiments of the present disclosure relate to waveguide antenna element (also referred to as a "waveguide aperture") and a multi-waveguide array comprising a plurality of such waveguide apertures. The multi-waveguide array is configured to directly couple to antenna elements of an array antenna. In embodiments, each waveguide aperture is coupled to a distinct antenna element. Each waveguide aperture is further configured to present (or emulate) a free space load impedance to each the antenna element to which the waveguide aperture is coupled (to thereby present a natural radiation impedance to the antenna element). In embodiments, the waveguide apertures are configured to be coupled to antenna elements provided as slot elements (e.g. so-called "dog-bone" antenna elements).

The multi-waveguide array can be provided as part of a testing device that samples slot amplitudes and phases or an array antenna. In embodiments, the testing device compares the slot amplitudes and phases and determines if they are correct (e.g., testing device can be used to determine if the amplitude and phase of a signal radiated form the slot element has an intended amplitude and phase). Accordingly, the multi-waveguide array enables the testing device to be used in a radio frequency (RF) subassembly environment. This enables expedient characterization of antenna feed quality before final assembly of an antenna (e.g. final assembly between an aperture portion and a feed portion of the antenna).

In embodiments, the multi-waveguide array enables a testing device to quantify a full milli-meter wave (mmW) seeker quality in both transmit (Tx) and receive (Rx) modes during antenna subassembly.

Advantageously, the multi-waveguide array provides a means to determine an antenna's expected quality without the use of an antenna measurement facility (far or near field). Because the multi-waveguide array does not require electromagnetic shielding, it can integrate RF testing into a subassembly workflow process using standard RF measurement equipment which cannot currently be used reliably to test antenna systems during subassembly.

In one aspect, a radio frequency (RF) adapter comprises a waveguide having a length, width, height, and a central longitudinal axis and internal electrically conducting surfaces. An impedance material is disposed along an interior of the waveguide. A reactive obstacle is disposed in the interior of the waveguide contacting one or more of the conducting surfaces. A resistive obstacle is disposed in the interior of the waveguide and may be free or in contact with one or more of the internal electrically conducting surfaces and along the central longitudinal axis.

In embodiments, the waveguide can be adapted to directly couple with an antenna ground plane to receive energy from a radiating element and into the waveguide. The waveguide, the impedance material, the reactive obstacle, and the resistive obstacle can further be arranged to provide a loading impedance substantially similar to that of free space.

In additional embodiments, the waveguide comprises an outer conductor. The impedance material can comprise a dielectric insulator. The impedance material can electrically attenuate an RF signal. In other examples, the impedance material can magnetically attenuate an RF signal. In further embodiments, the impedance material can electrically and magnetically attenuate an RF signal. In other embodiments, the impedance material can comprise a magnetic media configured to attenuate a primary magnetic field along the length of the waveguide. In yet another embodiment, the impedance material can comprise a ferromagnetic media configured to attenuate a primary surface currents along the length of the waveguide.

In further embodiments, the resistive obstacle can comprise a resistive card (R-card) configured to attenuate a primary electric field along the length of the waveguide. The resistive R-card can be tapered along the length of the waveguide.

In embodiments, the dielectric insulator can comprise a loss dielectric configured to attenuate a primary electric field along the length of the waveguide.

In yet additional embodiments, the reactive obstacle presents an inductance to counter a capacitive waveguide effect. The reactive obstacle comprises metallic fins disposed along one or more walls of the waveguide. In other embodiments, the reactive obstacle comprises metallic posts disposed along one or more walls of the waveguide.

In another aspect, an RF sensor testing fixture comprises a housing. A plurality of waveguides are disposed within the housing and have a length, width, height, and a central longitudinal axis and an internal surface. A connector is coupled to a first end of each distinct one of the plurality of waveguides such that each pin is operable to output an RF output signal from each waveguide to an RF testing device.

In embodiments, a dielectric material can be disposed through the interior of each waveguide. A resistive impedance can be disposed along the central longitudinal axis of each waveguide. A reactive impedance can further be disposed in the internal surface of each waveguide.

In additional embodiments, an antenna interface can be configured to directly couple each of the waveguides to a distinct one of a plurality of radiating elements of an antenna array. Each of the waveguides and their respective impedances can be arranged to provide an antenna loading impedance substantially similar to that of free space. Each of the waveguides can comprise an outer conductor and an volume of each waveguide can comprise impedance transforming materials. The impedance transforming material can comprises a Teflon dielectric insulator.

In further embodiments, the resistive impedance can comprise a tapered resistive card (R-card) configured to attenuate a primary electric field along the length of each of the waveguides. Additionally, each reactive impedance can present an inductance to counter a capacitive waveguide effect. Each reactive impedance can comprise metallic fins or posts disposed alone one or more walls of the waveguide.

BRIEF DESCRIPTION OF THE DRAWINGS

The foregoing and other objects, features and advantages will be apparent from the following more particular description of the embodiments, as illustrated in the accompanying drawings in which like reference characters refer to the same parts throughout the different views. The drawings are not necessarily to scale, emphasis instead being placed upon illustrating the principles of the embodiments.

DETAILED DESCRIPTION

Figure 1:
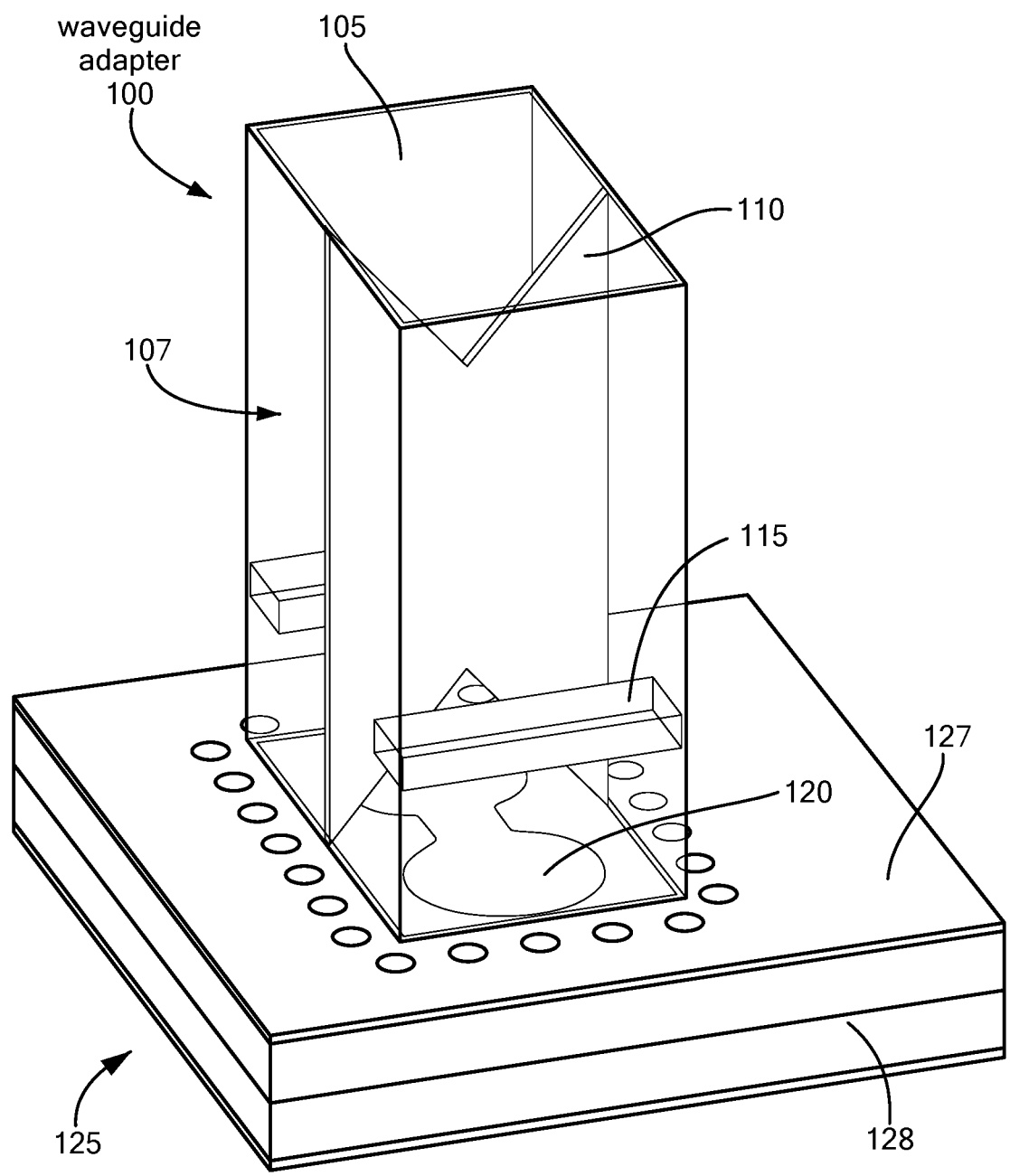
FIGS. 1-1C are block diagrams of a radio frequency (RF) waveguide adapter according to example embodiments described herein.
Figure 1A:
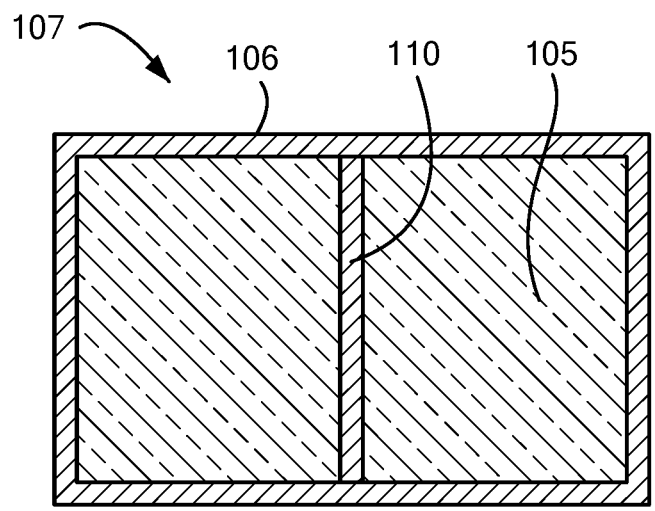
Figure 1B:
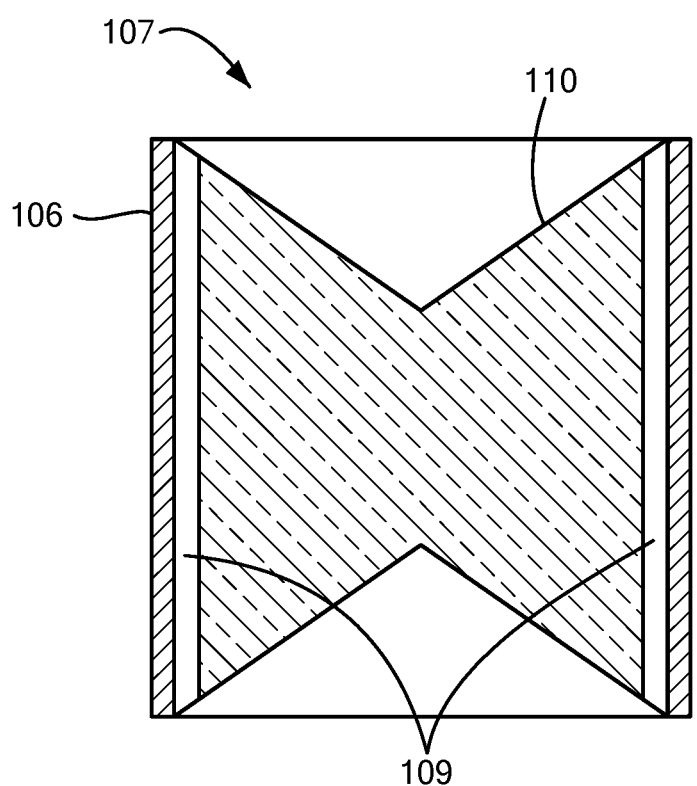
Figure 1C:
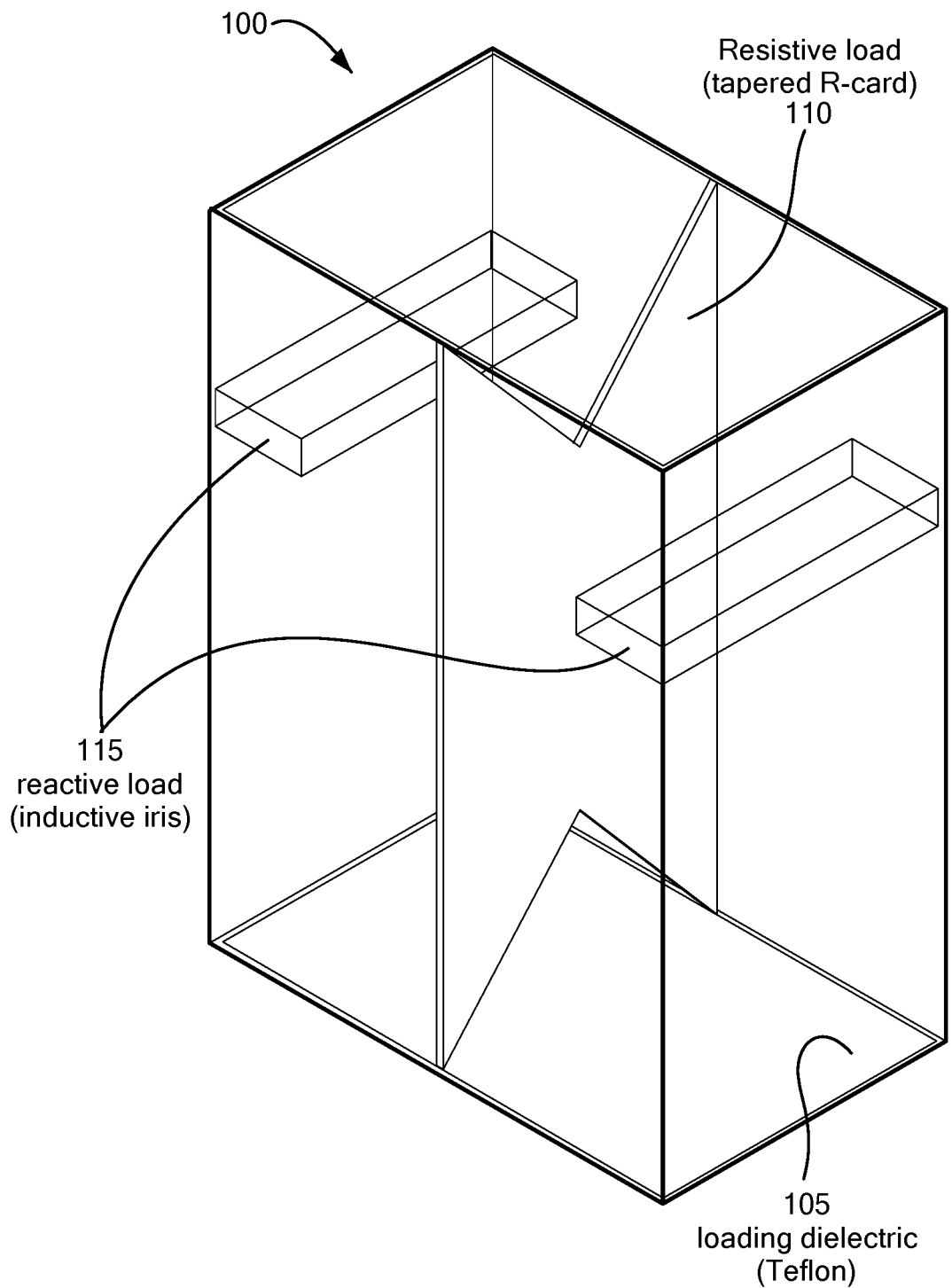

Referring to FIGS. 1-1C, in which like elements are provided having like reference designations, a waveguide adapter 100 is coupled to a planar antenna array 125 that comprises an antenna ground plane 127 and internal stripline circuits as is generally known (for clarity, only a portion of waveguide adapter 100 and one antenna element of the antenna radiating element 125 are shown in FIG. 1). A skilled artisan understands that the adapter 100 is tailored to a slot style radiating element and can be directly coupled to any antenna system such as a phased array antenna system comprising any type of slot or printed circuit antenna element (e.g. a dipole element, a patch element, or any other type of element. Also, it is understood that the antenna radiating elements need not lay on a planar surface but can be conformal. Furthermore, one skilled in the art recognizes that other non-rectangular wave guiding structures can be employed for a multitude of radiating elements. Any wave guiding structure employed should contact an antenna ground surface, couple to the radiating element, and present an equivalent free space radiation load to the antenna element.

The waveguide adapter 100 comprises a waveguide (WG) 107 that is directly coupled to a slot antenna element 120 (here illustrated as a so-called "dog-bone" slot element) disposed on or otherwise provided in a ground plane 127 of the planar antenna array 125. Although the WG 107 is depicted as a rectangular waveguide, a skilled artisan understands that any wave guiding structure can be employed, e.g., a circular or square waveguide, that is configured to mimic a free space load. For example, by making direct contact with the antenna element 120 and the antenna ground plane 127, the WG 107 enables modes of propagation to be establish and enables energy to be coupled from the radiating element 120 into the waveguide 107.

The WG 107 comprises loads 105, 110, 115 configured to mimic a load that an antenna element 120 would see if it was otherwise radiating into free space. For example, the WG 107 can comprise an impedance material (e.g., a filled dielectric) 105, and a resistive load (also referred to as a resistive obstacle) 110 and a reactive load (also referred to as a reactive obstacle) 115 that are configured to provide the antenna element 120, when driven, with a similar reaction as free space which is demonstrated by the reflection plot 210 of FIG. 2 described in greater detail herein.

In embodiments, the WG 107 comprises a conductor 106 having an internal surface. The internal surface is configured to receive the loading dielectric 105, and resistive load 110. The resistive load 110 is secured or otherwise held along a central longitudinal axis of the WG so that a primary electric field is gradually attenuated along a length of the WG 107. In embodiments, the loading dielectric 105 can hold the resistive load 110 such that it may be separate or in contact with 106 internal surface. The resistive load 110 can either be held in place (e.g., sandwiched) or directly attached (e.g., sputtered) to the loading dielectric 105 along the central longitudinal axis. Contemporaneously, the reactive load 115 is secured or otherwise held in the WG 107 so as to present an inductive load to counter a capacitive waveguide effect.

In embodiments, the conductor 106 comprises a conductive material (e.g. brass, copper, silver, aluminum, or any metal that has low bulk resistivity or even metals having poor conductivity characteristics (including, but not limited to dielectric materials) and having interior walls which are plated or otherwise covered with a material having good conductivity characteristics). The waveguide loading material 105 can be any suitable non-conducting dielectric, such as Teflon, that allows the waveguide size to be constrained through dielectric loading of the waveguide. The resistive load 110 can comprise a tapered resistive material. For example, the tapered resistive material can be a tapered resistive card (R-card). The resistive material serves to alter the wave impedance seen at the antenna load side of the adapter and gradually attenuate the field so to mimic directional propagation. An attenuating material can be dispersed throughout the dielectric and/or deposited along the waveguide walls to create this effect. In some examples, the reactive load 115 can comprise metallic fins. Persons skilled in the art understand other structures such as imbedded rings, inductive posts, etc. may be used to affect a reactance which counters the coupled waveguide reactive element.

In embodiments, the resistive load 110 can be disposed along a central longitudinal axis of the waveguide 107. In some examples, the reactive load 115 forms an inductive iris that is disposed along the waveguide at a distance from the antenna element 120 so as to cancel a waveguide coupling reactance as seen by the antenna element 120.

As stated herein, the rectangular waveguide adapter 100 comprising the WG and the loading elements 105, 110, 115 transforms a standard waveguide impedance to an impedance that mimics or corresponds to that of a free space load for the antenna element 120. As such, the adapter 100 can be used with a measurement fixture (e.g., fixture 400 of FIG. 4) so that a single or multitude of antenna elements can be tested in a working production environment through standard scattering parameter (S-parameter) measurement techniques. By measuring and analyzing S-parameters, the adapter 100 provides a means to identify antenna component irregularities at a sub-system level (e.g. by comparing measured S-parameters to expected S-parameter values such as threshold values or expected ranges of values).

For example, by mimicking free space load (e.g. by modelling a free space impedance to be present to an antenna element), the adapter 100 enables a testing device (not shown) that can be mechanically and electrically coupled to the adapter 100. For example, the adapter 100 can enable the RF testing device to obtain transmission phase and amplitude measurements of one or more radiating slot antenna elements 120 of the antenna array 125. In this way, the adapter 100 enables the capture of registration errors and performance deviations of antenna elements.

Although FIGS. 1-1C illustrate one technique for loading a rectangular waveguide adapter, a skilled artisan understands that other loading methods and/or waveguide shapes may be used to achieve a similar loading effect for antenna element 120. It should be further noted that the structure and materials shown in FIGS. 1-1C are one method of creating a direct contact adapter. Persons skilled in the art could use other waveguide shapes, loading materials, reactive and attenuating loads to achieve a similar result. For example, structures and materials can be employed that act on a magnetic field component and/or act on both the electric and the magnetic field components together. For instance, the resistive load 110 can comprise a MAG-RAM material (magnetic field absorber material) to attenuate the energy and shift the waveguide impedance.

Figure 2:
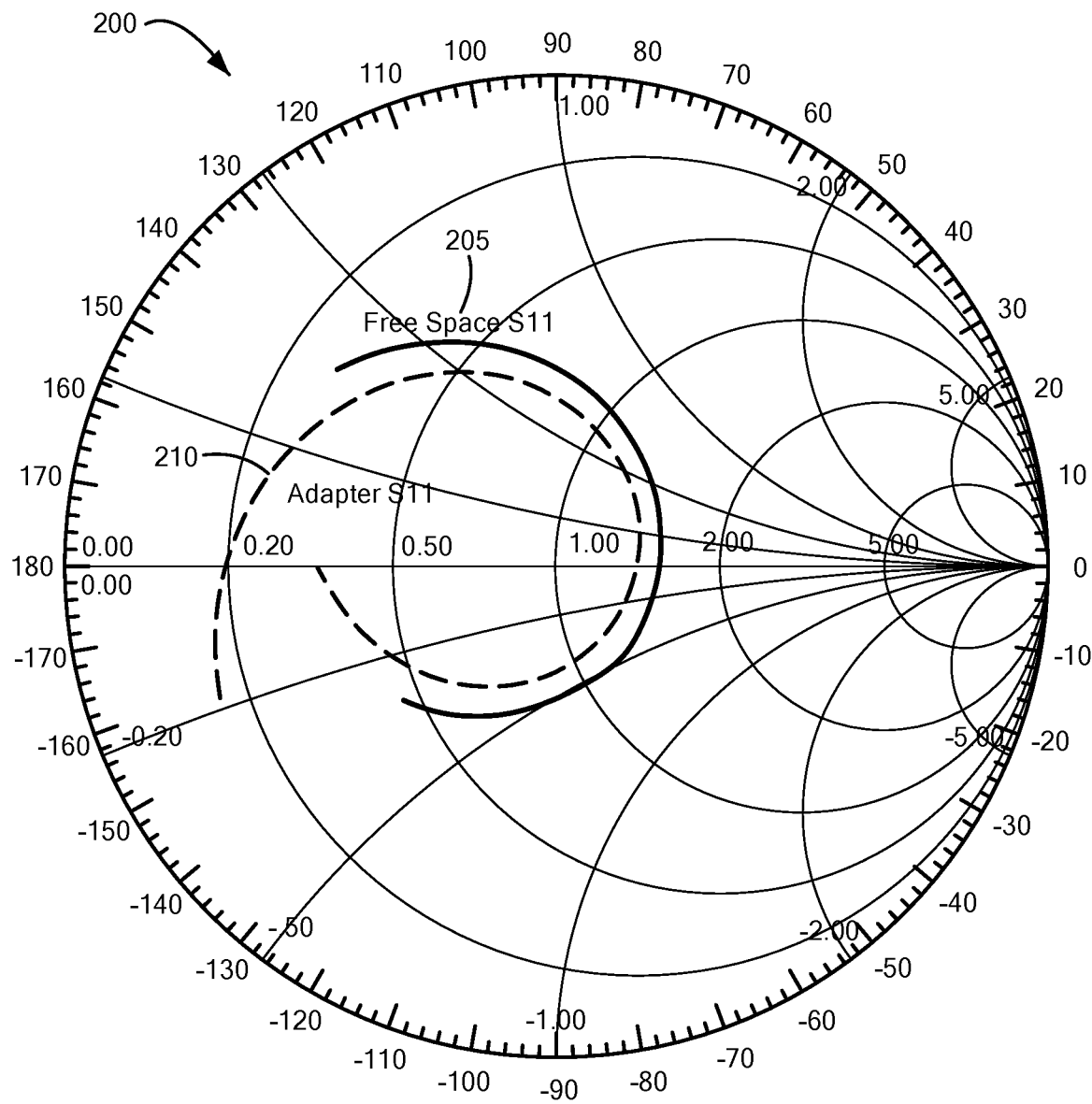
FIG. 2 is a graph illustrating a slot feed impedance provided by the RF waveguide load of FIG. 1 as compared to a slot feed impedance provided by a free space load on a slot antenna according to example embodiments described herein.

Referring to FIG. 2, a Smith chart 200 includes curve 205 which corresponds to free space impedance reflection coefficient (i.e. S11) at a first frequency. Curve 210 corresponds to a free space "mimicked" impedance reflection coefficient at the first frequency (e.g. as may be measured at the feed port (not shown) for the radiating element 120 with the concepts, structures and techniques described herein such as the waveguide adapter described above in conjunction with FIGS. 1 and 1A). By comparing curves 205, 210 it can be seen that good correspondence is achieved (i.e. the reflection coefficient of the radiating element with the waveguide adapter coupled has good correspondence with the reflection coefficient radiating element radiating into free space).

Thus, the impedance loaded adapter 100 of FIG. 1 provides the slot antenna element 120 of FIG. 1, when driven, an impedance corresponding to a free space mimicked impedance as illustrated by curve 210 which is similar to that of free space impedance, as illustrated by free space impedance curve 205.

Figure 3:
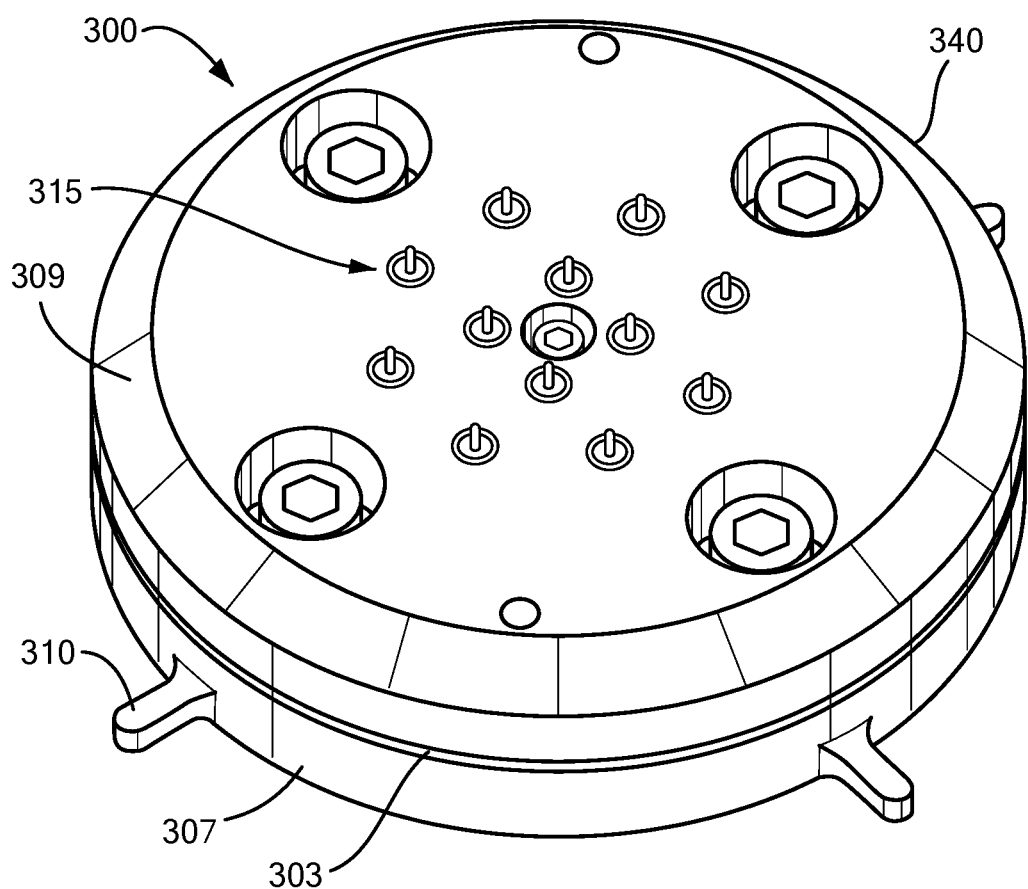
FIGS. 3-3A are block diagrams of an RF waveguide adapter according to example embodiments described herein.
Figure 3A:
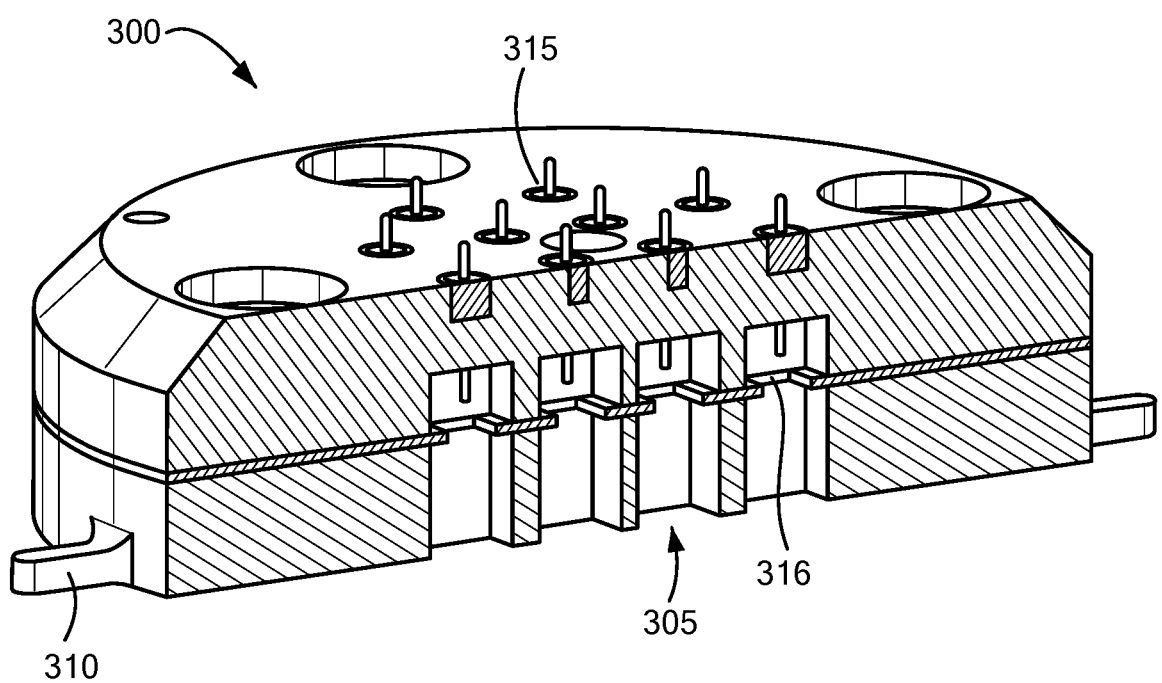

Referring to FIGS. 3-3A in which like elements are provided having like reference designations, an antenna array adapter 300 comprises a grouping of waveguide adapters 100. In this embodiment a housing 340 having a top portion 309, center portion 303 and a bottom portion 307. The top portion 309 comprises connectors (or RF ports) 315. The center section 303 comprises a reactive element and the bottom portion 307 contacts the antenna array. In embodiments, the connectors 315 form a 12-port adapter (or testing interface) that enable a testing device (not shown) to perform measurements on an antenna and/or antenna feed (so as to characterize the antenna elements transfer function). Those of ordinary skill in the art will appreciate, of course, that adapter 300 may include any number of pins necessary to suit the needs of a particular application. Also, not shown for clarity is the waveguide loading dielectric 105 and resistive material 110.

In embodiments, the waveguide adapter 300 can comprise a plurality of WGs 305. The number of WGs 305 can correspond to a number of antenna elements (e.g., slot antenna elements) included in an antenna array onto which the adapter 300 is to be directly coupled. The WGs 305 can be spaced apart so as to directly couple to each antenna element and enable energy to be coupled from each antenna element into each respective WG 305.

Figure 4A:
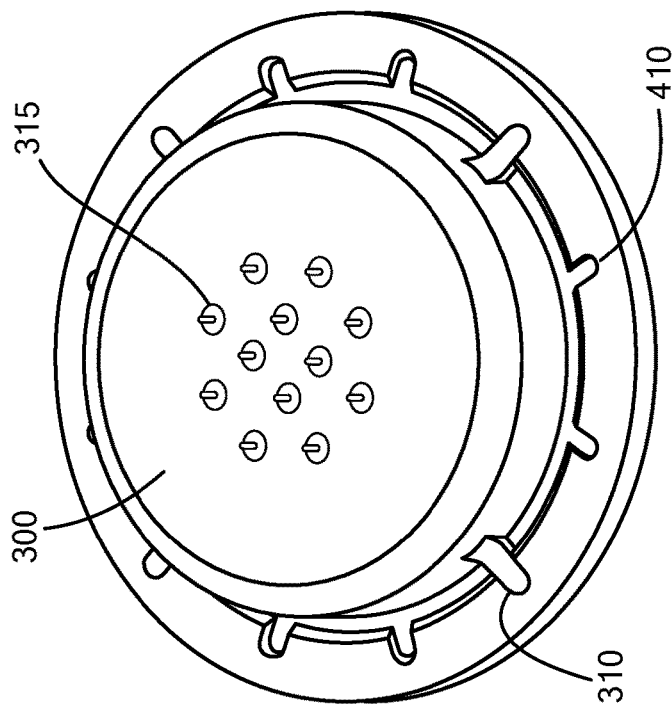
FIGS. 4-4A are block diagrams of the RF waveguide adapter being directly coupled to a slot antenna according to example embodiments described herein.
Figure 4:
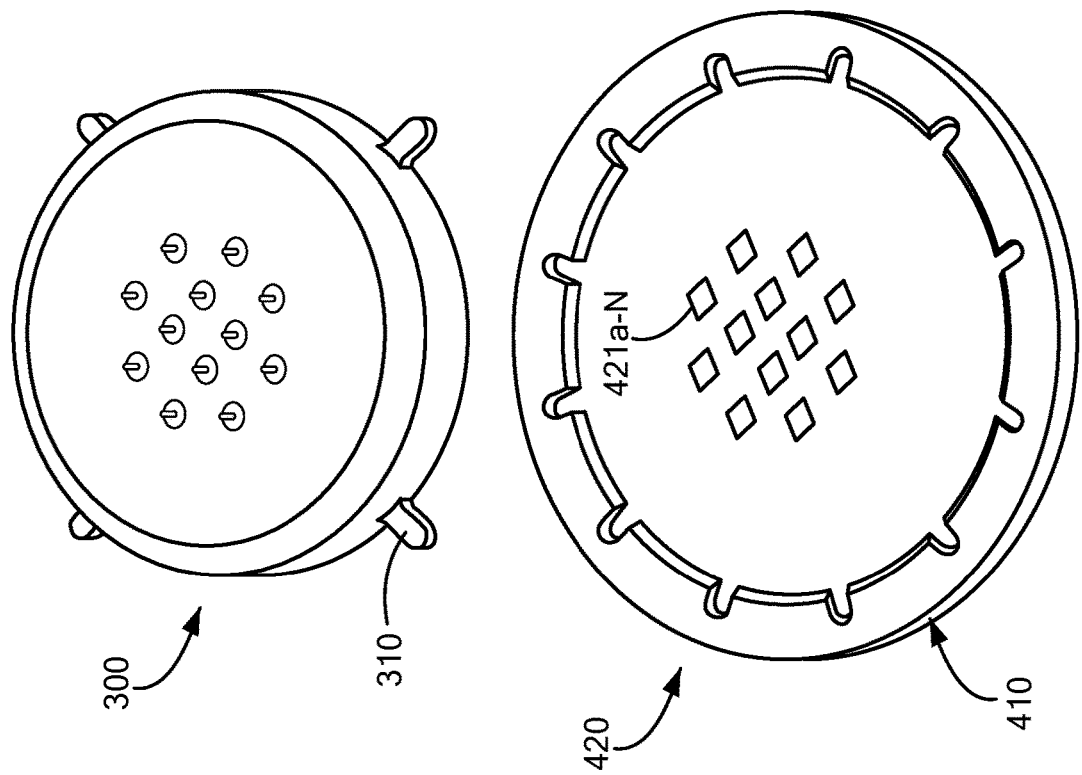

In further embodiments, the bottom portion 307 can comprise an antenna array interface 310 configured to couple the adapter 300 onto an antenna array (e.g., antenna array 420 of FIG. 4). The array interface 310 can be any known or yet to be known mechanical interface means that enable the adapter 300 to be coupled to the antenna array.

Referring to FIGS. 4-4A, an antenna array 420 comprising a plurality of antenna elements 421a-N includes an adapter interface 410. For example, the adapter interface 410 can be formed as receiving slots that receive antenna tabs (not numbered) that define the antenna array interface 310. The slots 410 can secure the antenna tabs based on a friction fit means, press fit means, interference fit means, and/or any other mechanical means. Accordingly, the adapter interface 410 enables the adapter 300 to electrically couple to the antenna array 420 such that energy is coupled from each of the antenna elements 421a-N into one of each of the WGs 305 of the adapter 300. Accordingly, a testing device can be used such that RF testing can occur during a subassembly workflow process. As such, antenna verification can occur by a supplier.

Comprise, include, and/or plural forms of each are open ended and include the listed parts and can include additional parts that are not listed. And/or is open ended and includes one or more of the listed parts and combinations of the listed parts.

One skilled in the art will realize the concepts described herein may be embodied in other specific forms without departing from the spirit or essential characteristics thereof. The foregoing embodiments are therefore to be considered in all respects illustrative rather than limiting of the concepts and embodiments described herein. The scope of the concepts sought to be protected herein is thus indicated by the appended claims, rather than by the foregoing description, and all changes that come within the meaning and range of equivalency of the claims are therefore intended to be embraced therein.

What is claimed is:

1. A radio frequency (RF) adapter comprising:
   a waveguide having a length, width, height, and a central longitudinal axis and internal electrically conducting surfaces;
   an impedance material disposed within an interior of the waveguide; and
   a reactive obstacle disposed in the interior of the waveguide contacting one or more of the conducting surfaces; and
   a resistive obstacle disposed in the interior of the waveguide and along the central longitudinal axis; and
   a resistive obstacle disposed in the interior of the waveguide free from contact with any of the conducting surfaces and along the central longitudinal axis.

2. The RF adapter of claim 1, wherein:
   the waveguide is adapted to directly couple with an antenna ground plane to receive energy from a radiating element and into the waveguide; and
   the waveguide, the impedance material, and the reactive and resistive obstacles are arranged to provide a loading impedance substantially similar to that of free space.

3. The RF adapter of claim 1, wherein the waveguide comprises an outer conductor.

4. The RF adapter of claim 1, wherein the impedance material comprises dielectric insulator.

5. The RF adapter of claim 1, wherein the impedance material electrically attenuates an RF signal.

6. The RF adapter of claim 1, wherein the impedance material magnetically attenuates an RF signal.

7. The RF adapter of claim 6, wherein the resistive obstacle comprises a resistive card (R-card) configured to attenuate a primary electric field along the length of the waveguide.

8. The RF adapter of claim 7, wherein the resistive R-card is tapered along the length of the waveguide.

9. The RF adapter of claim 4, wherein the dielectric insulator comprises a loss dielectric configured to attenuate a primary electric field along the length of the waveguide.

10. The RF adapter of claim 7, wherein the impedance material comprises a magnetic media configured to attenuate a primary magnetic field along the length of the waveguide.

11. The RF adapter of claim 7, wherein the impedance material comprises a ferromagnetic media configured to attenuate a primary surface currents along the length of the waveguide.

12. The RF adapter of claim 1, wherein the reactive obstacle presents an inductance to counter a capacitive waveguide effect.

13. The RF adapter of claim 1, wherein the reactive obstacle comprises metallic fins disposed along one or more walls of the waveguide.

14. The RF adapter of claim 13, wherein the reactive obstacle comprises metallic posts disposed along one or more walls of the waveguide.

* * * * *